(12) United States Patent
Maejima et al.

(10) Patent No.: US 7,453,742 B2
(45) Date of Patent: Nov. 18, 2008

(54) SEMICONDUCTOR INTEGRATED CIRCUIT DEVICE

(75) Inventors: Hiroshi Maejima, Chigasaki (JP); Koji Hosono, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/534,846

(22) Filed: Sep. 25, 2006

(65) Prior Publication Data

US 2007/0133316 A1 Jun. 14, 2007

(30) Foreign Application Priority Data

Dec. 13, 2005 (JP) .............................. 2005-359336

(51) Int. Cl.
  *G11C 5/14* (2006.01)
(52) U.S. Cl. ............................ 365/189.09; 365/185.21; 365/185.25
(58) Field of Classification Search ............ 365/185.21, 365/189.09, 185.25
  See application file for complete search history.

(56) References Cited

U.S. PATENT DOCUMENTS

| | | | |
|---|---|---|---|
| 6,370,061 B1 * | 4/2002 | Yachareni et al. | 365/185.22 |
| 6,438,038 B2 * | 8/2002 | Ikehashi et al. | 365/185.24 |
| 6,697,294 B1 * | 2/2004 | Qi et al. | 365/210 |
| 6,700,814 B1 * | 3/2004 | Nahas et al. | 365/158 |
| 6,711,068 B2 * | 3/2004 | Subramanian et al. | 365/189.02 |
| 6,765,374 B1 * | 7/2004 | Yang et al. | 323/280 |
| 6,813,190 B2 * | 11/2004 | Marotta et al. | 365/185.2 |
| 6,870,421 B2 * | 3/2005 | Abe | 327/539 |
| 6,879,520 B2 * | 4/2005 | Hosono et al. | 365/185.17 |
| 6,907,497 B2 * | 6/2005 | Hosono et al. | 711/103 |
| 7,023,736 B2 * | 4/2006 | Cernea et al. | 365/185.21 |
| 7,119,802 B2 * | 10/2006 | Suyama et al. | 345/208 |
| 2002/0009012 A1 * | 1/2002 | Fujioka et al. | 365/227 |
| 2002/0039313 A1 * | 4/2002 | Kuriyama | 365/200 |
| 2002/0048191 A1 * | 4/2002 | Ikehashi et al. | 365/185.22 |
| 2003/0016551 A1 * | 1/2003 | Takemura et al. | 365/63 |

OTHER PUBLICATIONS

June Lee, et al., "A 1.8V 2Gb NAND Flash Memory for Mass Storage Applications", Digest of Technical Papers, IEEE, ISSCC 2003/Session 16/Non-Volatile Memory/Paper 16.7, Salon 10-15, vol. 1, Feb. 11, 2003, 2 pages.

\* cited by examiner

*Primary Examiner*—Huan Hoang
*Assistant Examiner*—Jay Radke
(74) *Attorney, Agent, or Firm*—Oblon, Spivak, McClelland, Maier & Neustadt, P.C.

(57) ABSTRACT

A semiconductor integrated circuit device includes a charge transfer transistor provided between a bit line and a sense amplifier, and a bit line clamp voltage generating circuit which generates bit line clamp voltage to be applied to the gate of the charge transfer transistor. The bit line clamp voltage generating circuit includes a current mirror circuit, a resistive dividing circuit provided between the input stage of the current mirror circuit and a reference potential node, a potential setting circuit provided between the output node of the resistive dividing circuit and the output stage of the current mirror circuit, and an operational amplifier which compares potential of the input stage of the current mirror circuit with reference potential to control the current mirror circuit. The operational amplifier is configured by transistors other than intrinsic transistors. The bit line clamp voltage is derived from the output stage of the current mirror circuit.

10 Claims, 8 Drawing Sheets

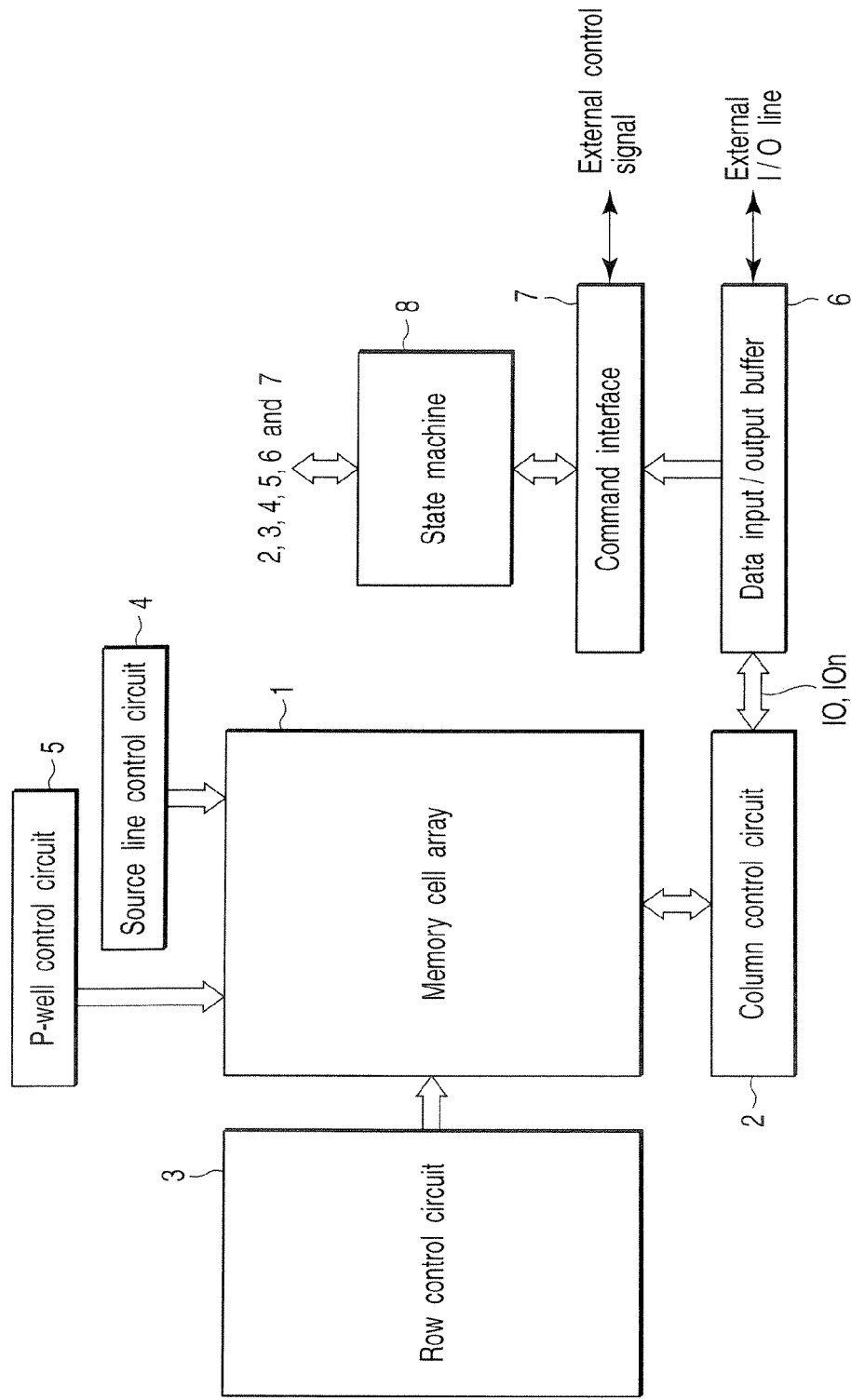
F I G. 1

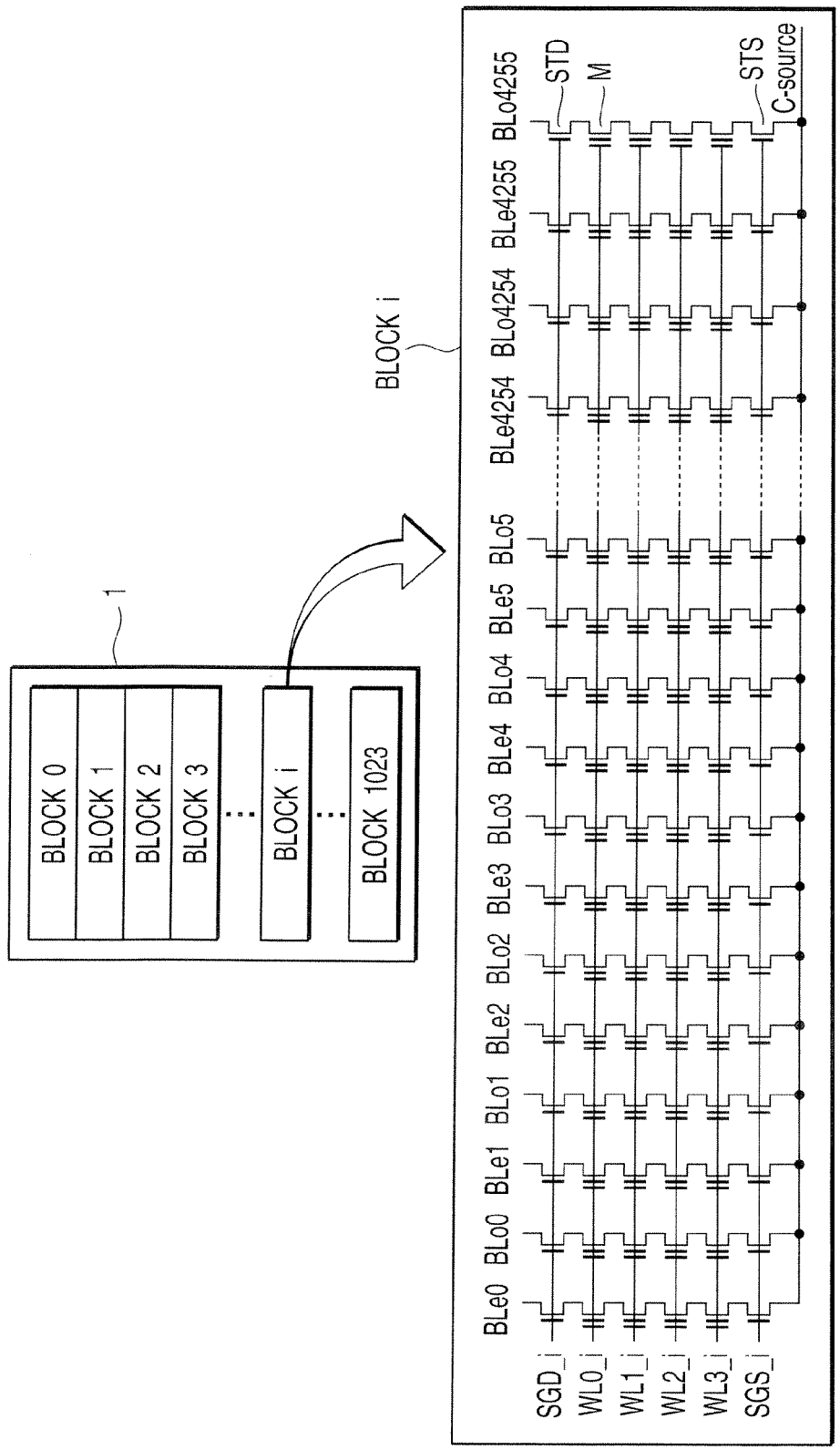
F I G. 2

14 Bit line clamp voltage generating circuit

SEMICONDUCTOR INTEGRATED CIRCUIT DEVICE

CROSS-REFERENCE TO RELATED APPLICATIONS

This application is based upon and claims the benefit of priority from prior Japanese Patent Application No. 2005-359336, filed Dec. 13, 2005, the entire contents of which are incorporated herein by reference.

BACKGROUND OF THE INVENTION

1. Field of the Invention

This invention relates to a semiconductor integrated circuit device and more particularly to a semiconductor integrated circuit device having an electrically rewritable nonvolatile semiconductor memory.

2. Description of the Related Art

The voltage used to control the gate of a transistor which transfers charges in a charge transfer sense amplifier used in a NAND flash memory or the like is called the bit line clamp voltage.

The bit line clamp voltage is set to the potential used to precharge the bit lines at the read time and set to the potential used to transfer charges from the bit line to the sense amplifier in the sensing operation after the end of precharging.

The bit line clamp voltage is generated by a bit line clamp voltage generating circuit. In the generating circuit, an operational amplifier (hereinafter referred to as an op-amp) which includes intrinsic transistors. The intrinsic transistor is a low-threshold voltage transistor having a threshold voltage of zero or approximately zero. The reason why the op-amp including intrinsic transistors is used in the bit line clamp voltage generating circuit is that it is necessary to generate low potential equivalent to potential Vsen (approximately 0.35 V) used to determine "1" or "0" by means of the sense amplifier.

However, a variation in the threshold voltage of the intrinsic transistor caused in the manufacturing process is large. Therefore, the operable voltage range of the op-amp will be limited when taking the temperature dependency of the transistor into consideration. As the whole portion of the circuit, the operable voltage range of the op-amp is limited and it becomes difficult to attain a sufficiently wide operable voltage range.

For example, the threshold voltage of the transistor becomes higher at low temperatures. Further, if a variation in the threshold voltage deflects to a higher level, the threshold voltage may exceed the input voltage Vclampref of the op-amp, for example, 0.35 V in some cases. If such a state occurs, the op-amp is not operated.

On the other hand, if a variation in the threshold voltage deflects to a lower level, the transistor of the op-amp cannot satisfy the relation of Vgs−Vth<Vds and does not perform the saturation region operation. Like the above case, the op-amp is not operated.

BRIEF SUMMARY OF THE INVENTION

A semiconductor integrated circuit device according to an aspect of the present invention comprises a bit line; a sense amplifier; a charge transfer transistor provided between the bit line and the sense amplifier; and a bit line clamp voltage generating circuit which generates bit line clamp voltage to be applied to the gate of the charge transfer transistor; the bit line clamp voltage generating circuit including a current mirror circuit having input and output stages, a resistive dividing circuit provided between the input stage of the current mirror circuit and a first reference potential node, a potential setting circuit provided between the output of the resistive dividing circuit and the output stage of the current mirror circuit, and an operational amplifier which is configured by use of transistors other than intrinsic transistors and compares potential of the input stage of the current mirror circuit with reference potential to control the current mirror circuit, wherein the bit line clamp voltage is derived from the output stage of the current mirror circuit.

BRIEF DESCRIPTION OF THE SEVERAL VIEWS OF THE DRAWING

FIG. 1 is a block diagram showing one example of a semiconductor integrated circuit device according to a first embodiment of this invention;

FIG. 2 is a diagram showing one example of a memory cell array shown in FIG. 1;

DETAILED DESCRIPTION OF THE INVENTION

Figure 3:
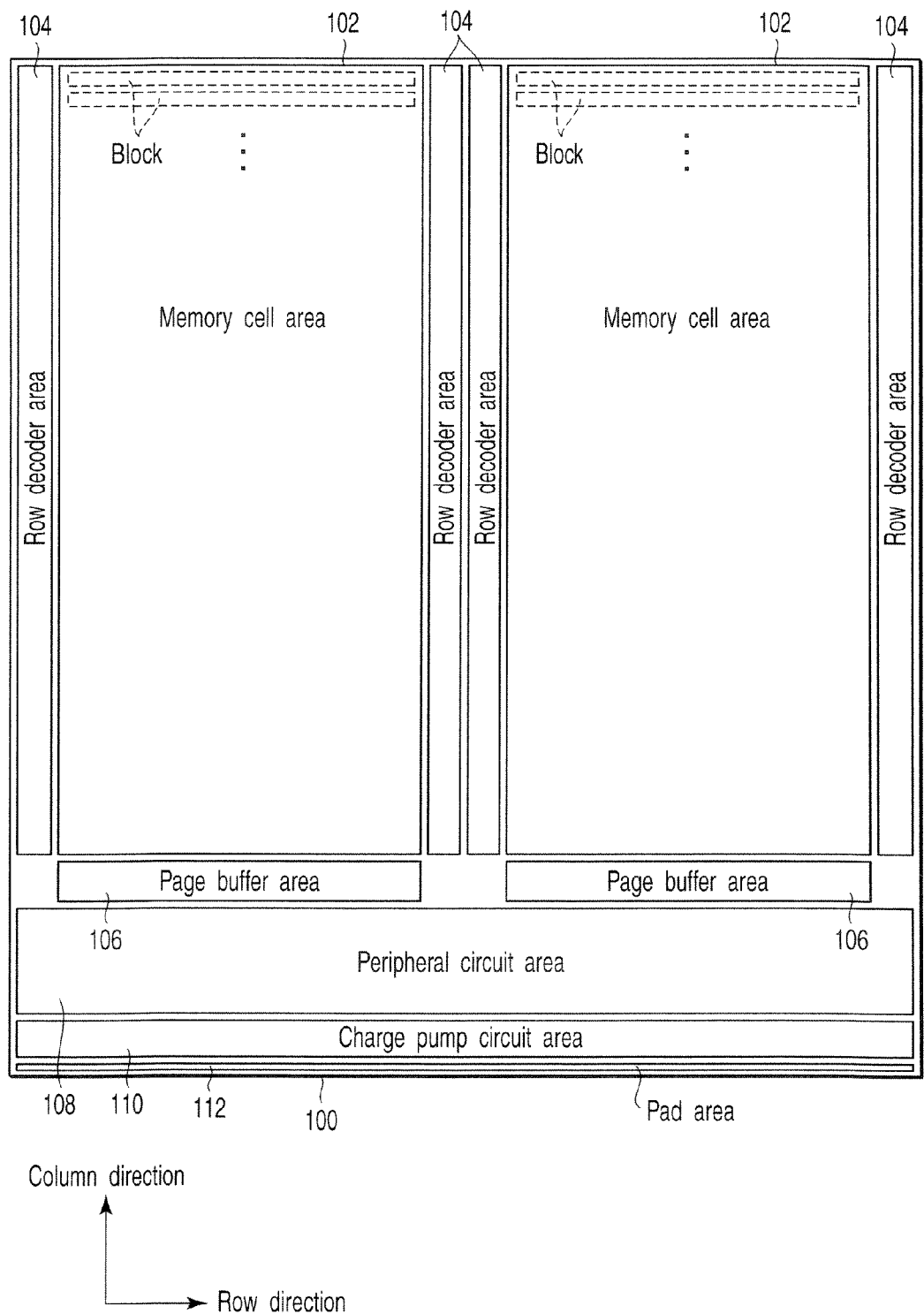
FIG. 3 is a plan view showing one example of a chip layout.

There will now be described embodiments of this invention with reference to the accompanying drawings. In this explanation, common reference symbols are attached to like portions throughout the drawings.

First Embodiment

FIG. 1 is a block diagram showing one example of a semiconductor integrated circuit device according to a first embodiment of this invention. In the first embodiment, a NAND flash memory is shown as one example of the semiconductor integrated circuit device, but this invention can be applied to a memory other than a NAND flash memory.

In a memory cell array 1, nonvolatile semiconductor memory cells are arranged in a matrix form. One example of the nonvolatile semiconductor memory cell is a flash memory cell.

A column control circuit 2 controls bit lines of the memory cell array 1 to perform the operation of erasing data in the memory cell, writing data into the memory cell and reading data from the memory cell. The column control circuit 2 is arranged adjacent to the memory cell array 1.

A row control circuit 3 selects one of word lines of the memory cell array 1 and applies potential required for erasing, writing and reading to the selected word line.

A source line control circuit 4 controls source lines of the memory cell array 1.

A P-well control circuit 5 controls the potential of a P-type cell well in which the memory cell array 1 is formed.

A data input/output buffer 6 is electrically connected to the column control circuit 2 via IO line pair IO, IOn and electrically connected to an external host (not shown) via an external I/O line. In the data input/output buffer 6, for example, an input/output buffer circuit is arranged. The data input/output buffer 6 receives write data, output readout data and receives address data and command data. The data input/output buffer 6 transfers received write data to the column control circuit 2 via the IO line pair IO, IOn and receives read data from the column control circuit 2 via the IO line pair IO, IOn. Further, it transfers address data input from the exterior in order to select an address of the memory cell array 1 to the column control circuit 2 and row control circuit 3 via a state machine 8. Further, it transfers command data from the external host to a command interface 7.

The command interface 7 receives a control signal from the external host via an external control signal line and determines whether data input to the data input/output buffer 6 is write data, command data or address data. If the input data is command data, it transfers the input data to the state machine 8 as command data.

The state machine 8 manages the whole portion of the flash memory. It receives command data from the external host and performs the data reading, writing, erasing and input/output management.

FIG. 2 is a diagram showing one example of the memory cell array 1 shown in FIG. 1.

As shown in FIG. 2, the memory cell array 1 is divided into a plurality of blocks, for example, 1024 blocks BLOCK0 to BLOCK1023. The block is a minimum unit for erasing. Each block BLOCKi includes a plurality of NAND memory units, for example, 8512 NAND memory units. In this example, each NAND memory unit includes two selection transistors STD, STS and a plurality of memory cells M (in this example, four memory cells) serially connected between the two selection transistors. One end of the NAND memory unit is connected to a bit line BL via the selection transistor STD whose gate is connected to a selection gate line SGD and the other end thereof is connected to a common source line C-source via the selection transistor STS whose gate is connected to a selection gate line SGS. The gate of each memory cell M is connected to a corresponding one of word lines WL. Even-numbered bit lines BLe counted from "0" and odd-numbered bit lines BLo are independently subjected to the data writing and readout operations. The data writing and reading operations are simultaneously performed for the 4256 memory cells connected to the bit lines BLe, for example, among the 8512 memory cells connected to one word line WL. One-bit data is stored in each memory cell M and one-bit data items of the 4256 memory cells are collected to configure one unit of page. For example, each page is a minimum unit for readout. When each memory cell M stores 2-bit data, the 4256 memory cells store data of two pages. Likewise, the 4256 memory cells connected to the bit lines BLo configure different two pages and the data writing and reading operations are simultaneously performed for the memory cells in the page.

FIG. 3 is a plan view showing one example of a chip layout.

As shown in FIG. 3, memory cell array areas 102, row decoder areas 104, page buffer areas 106, peripheral circuit area 108, charge pump circuit area 110 and pad area 112 are provided on a semiconductor chip 100.

In this example, two memory cell array areas 102 are provided and the memory cell array 1 is provided in each memory cell array area.

The row decoder areas 104 are arranged on both sides of the memory cell array areas 102 in the row direction and the row control circuit 3 is laid out in each row decoder area.

The page buffer areas 106, peripheral circuit area 108, charge pump circuit area 110 and pad area 112 are sequentially arranged on one end portion of the semiconductor chip 100 in the column direction.

In the page buffer area 106, a column control circuit, for example, a page buffer is laid out. The page buffer is one type of a data circuit. It temporarily stores data to be written into the memory cell array 1, for example, write data of one page and temporarily stores data read from the memory cell array 1, for example, read data of one page.

In the peripheral circuit area 108, the column-series control circuit 2, data input/output buffer 6, command interface 7 and state machine 8 are laid out.

In the charge pump circuit area 110, a charge pump circuit is laid out. The charge pump circuit is one type of a booster circuit and generates power supply potential required for writing and erasing, for example, potential higher than the external power supply potential or in-chip power supply potential used in the chip.

In this example, one pad area 112 is provided and arranged on one side of the chip. In the pad area 112, pads are laid out. The pads are connection nodes between the semiconductor chip 100 and the exterior. For example, the pads are connected to the data input/output buffer 6 and command interface 7.

(Concept of Charge Transfer Type Sense Amplifier)

Figure 4:
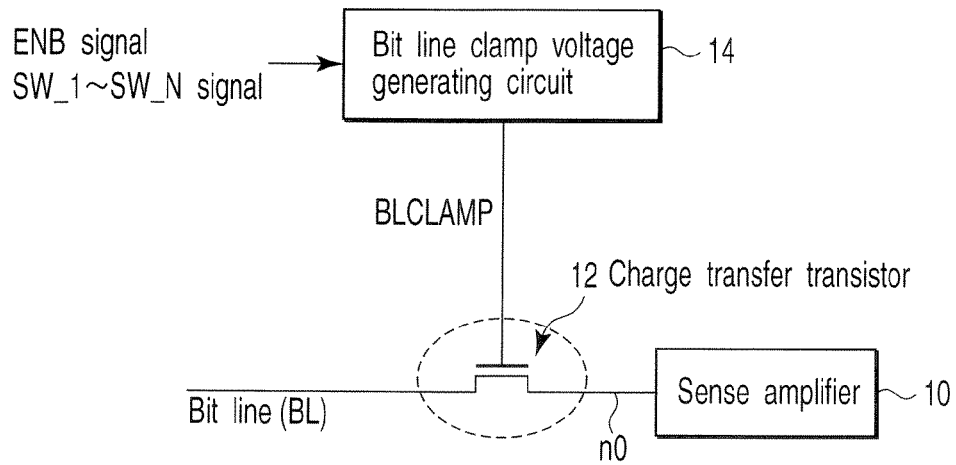
FIG. 4 is a diagram showing the concept of a charge transfer type sense amplifier.

FIG. 4 is a diagram showing the concept of a charge transfer type sense amplifier. In FIG. 4, a single-ended charge transfer type sense amplifier is shown.

Figure 5:
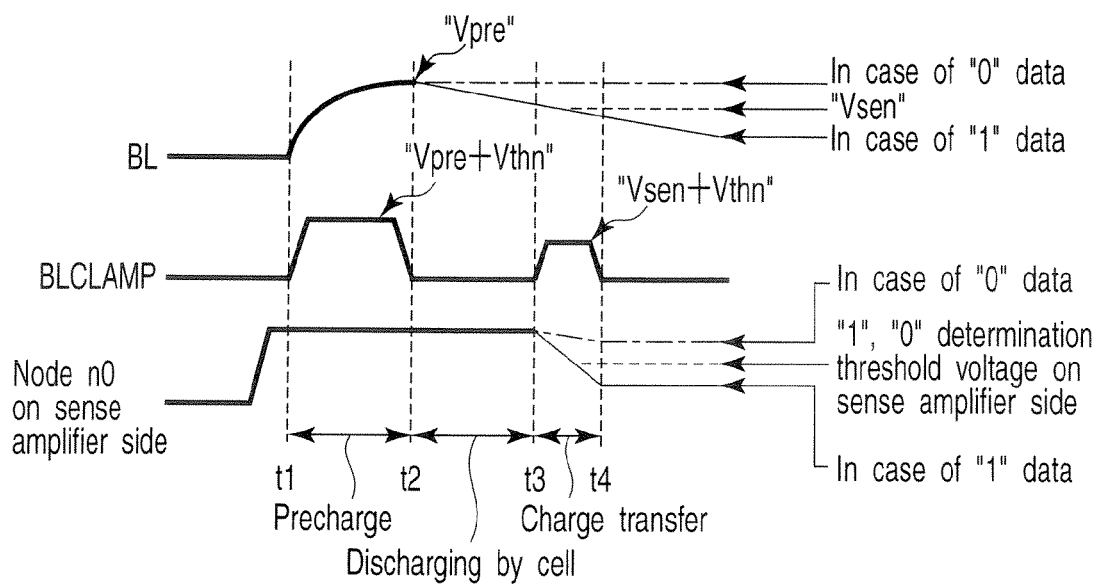
FIG. 5 is a potential waveform diagram showing potential waveforms of a bit line, sense amplifier side node and bit line clamp voltage at the read operation time.

As a sense amplifier of the NAND flash memory, a single-ended charge transfer type sense amplifier 10 is generally used. For example, the sense amplifier 10 is contained in the page buffer and connected to the bit line BL via a charge transfer transistor 12 as shown in FIG. 4. The gate of the charge transfer transistor 12 is controlled by bit line clamp voltage BLCLAMP. The bit line clamp voltage BLCLAMP is generated from a bit line clamp voltage generating circuit 14. FIG. 5 shows potential waveforms of the bit line, sense amplifier side node n0 and bit line clamp voltage BLCLAMP at the read operation time.

As shown in FIG. 5, first, the bit line clamp voltage generating circuit 14 generates voltage BLCLAMP which is set to "Vpre+Vthn" at the first rise time. In this case, Vthn indicates the threshold voltage of the charge transfer transistor 12. The charge transfer transistor 12 is turned on and the bit line BL is charged to the potential Vpre which is lowered by the threshold voltage Vthn (time t1).

After charging the bit line to the potential Vpre, the voltage BLCLAMP is set to zero to cut off the bit line BL from the sense amplifier 10. In this state, if the selection gate of a NAND string (not shown) is turned on, the potential of the bit line BL is changed according to data stored in the memory cell. When data "0" is stored in the memory cell, the memory cell is turned off. Therefore, the potential of the bit line BL is not substantially lowered from the potential Vpre. On the other hand, when data "1" is stored in the memory cell, the memory cell is turned on. Therefore, the potential of the bit line BL is lowered from the potential Vpre towards potential VSS (for example, zero) (time t2).

Next, the bit line clamp voltage generating circuit 14 generates voltage BLCLAMP which is set to "Vsen+Vthn". Vsen is the determination threshold voltage of the sense amplifier 10 used to determine "1" or "0". When the potential of the bit line BL is set equal to or less than the potential Vsen, the charge transfer transistor 12 is turned on and charges are transferred from the bit line BL towards the sense amplifier 10 (time t3). When the charge transfer transistor 12 is turned on, the potential of the node n0 which lies on the sense amplifier side and is charged to the potential Vpre is lowered to a potential near the potential Vsen. In response to this, the sense amplifier 10 determines data "1" and amplifies an infinitesimal potential difference appearing on the bit line to a larger potential difference. On the other hand, when the potential of the bit line BL exceeds the potential Vsen or maintains potential equal to or higher than the potential Vsen, the charge transfer transistor 12 is turned off and no charges are transferred. At this time, the node n0 maintains the potential Vpre. In response to this, the sense amplifier 10 determines data "0" (time t4).

Thus, the bit line clamp voltage BLCLAMP is set to a potential obtained by adding the potential Vpre (approximately 0.6 V) or potential Vsen (approximately 0.35 V) to the threshold voltage Vthn of the charge transfer transistor 12.

(Bit Line Clamp Voltage Generating Circuit)

The bit line clamp voltage BLCLAMP is generated from the bit line clamp voltage generating circuit 14. One example of the configuration of the bit line clamp voltage generating circuit 14 provided in the semiconductor integrated circuit device according to the first embodiment of this invention is shown in FIG. 6 and one example of the circuit is shown in FIG. 7.

Figure 6:
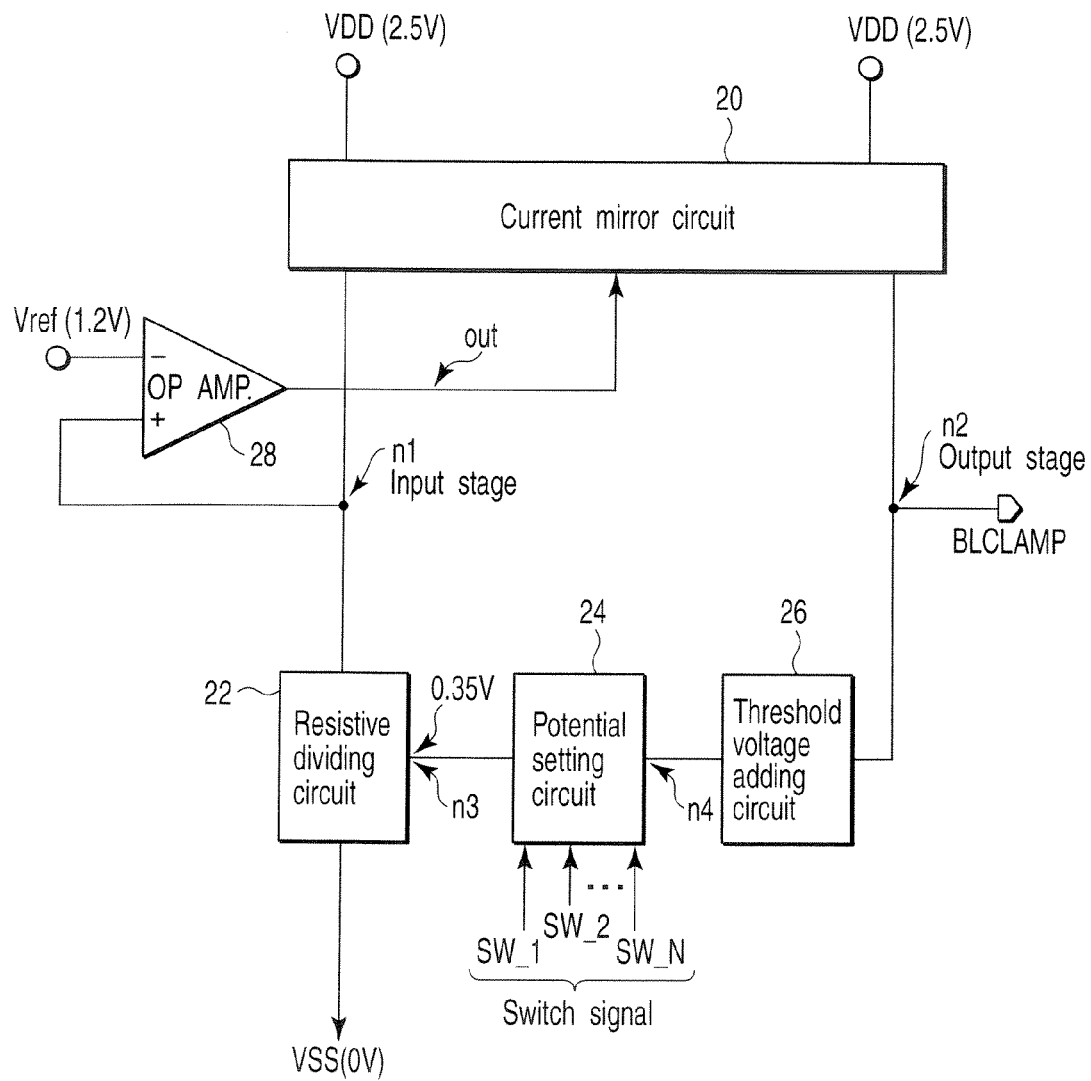
FIG. 6 is a block diagram showing one example of the configuration of a bit line clamp voltage generating circuit provided in the semiconductor integrated circuit device according to the first embodiment of this invention.
Figure 7:
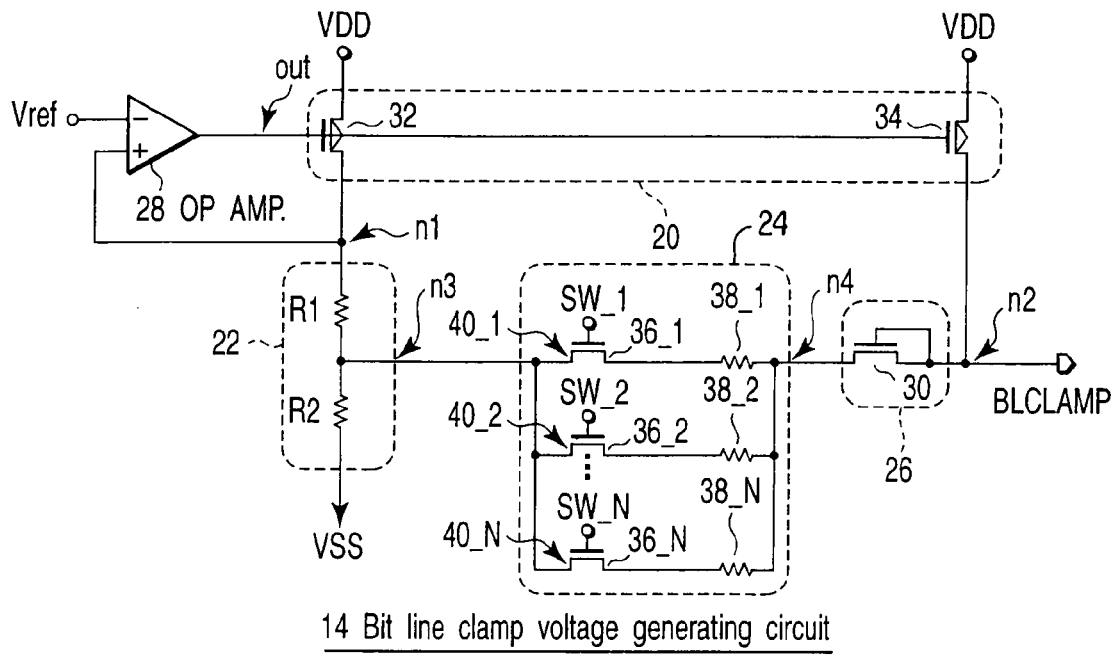
FIG. 7 is a circuit diagram showing one circuit example of the bit line clamp voltage generating circuit shown in FIG. 6.

As shown in FIG. 6, the bit line clamp voltage generating circuit 14 includes a current mirror circuit 20, resistive dividing circuit 22, potential setting circuit 24, threshold voltage adding circuit 26 and operational amplifier (hereinafter referred to as an op-amp) 28.

The current mirror circuit 20 has an input stage n1 and an output stage n2. The resistive dividing circuit 22 is provided between the input stage n1 of the current mirror circuit 20 and a first reference potential node. The first reference potential in this example is ground potential VSS, for example.

The potential setting circuit 24 is provided between an output node n3 of the resistive dividing circuit 22 and the output stage n2 of the current mirror circuit 20. In this example, the potential setting circuit 24 is provided and an output node n4 of the potential setting circuit 24 is connected to the output stage n2 via the threshold voltage adding circuit 26.

The threshold voltage adding circuit 26 is a circuit which adds the potential of the threshold voltage of the charge transfer transistor 12 and prevents the output voltage from being lowered by the threshold voltage of the charge transfer transistor 12. The threshold voltage adding circuit 26 may be provided as required. As shown in the circuit diagram of FIG. 7, the threshold voltage adding circuit 26 of this example includes a transistor 30 which has the same size and threshold voltage as those of the charge transfer transistor 12. The gate of the transistor 30 of this example is connected to one end of the current path thereof. The transistor is so-called diode-connected. One end (anode) of the current path which is connected to the gate is connected to the output stage n3 and the other end (cathode) of the current path is connected to the output node n4 of the potential setting circuit 24.

Figure 8:
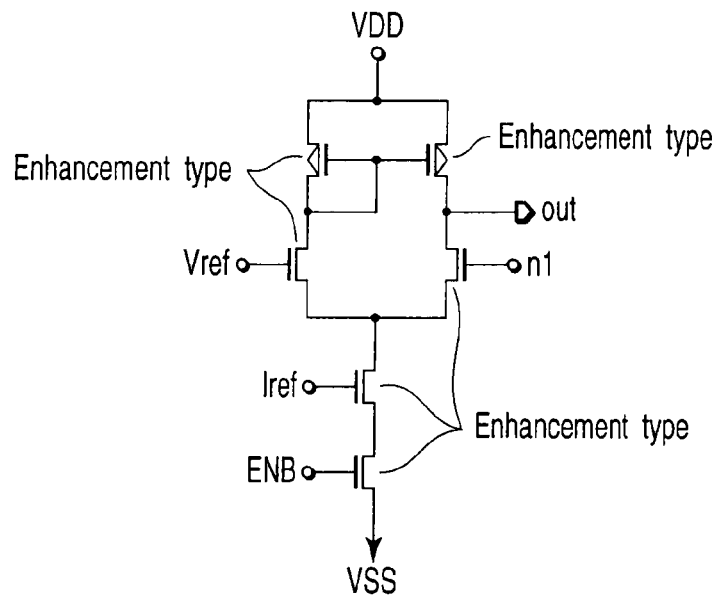
FIG. 8 is a circuit diagram showing one circuit example of an operational amplifier shown in FIG. 6.

The op-amp 28 compares the potential of the input stage n1 of the current mirror circuit 20 with the reference potential Vref to control the current mirror circuit 20. One example of the reference potential Vref is 1.2 V which is approximately half the power supply potential VDD (2.5 V). The op-amp 28 of this example is configured by transistors other than intrinsic transistors. One example of the circuit of the op-amp 28 is shown in FIG. 8. As shown in FIG. 8, the op-amp 28 is configured by transistors other than intrinsic transistors and is configured by using only enhancement type N-channel transistors in one example of the circuit.

The bit line clamp voltage BLCLAMP is obtained from the output stage n2 of the current mirror circuit 20.

As shown in the circuit diagram of FIG. 7, the current mirror circuit of one example includes first and second transistors 32 and 34. The current path of the first transistor 32 is connected at one end to a second reference potential node and connected at the other end to the input stage n1 and the gate thereof is supplied with an output "out" of the op-amp 28. The current path of the second transistor 34 is connected at one end to the second reference potential node and connected at the other end to the output stage n2 and the gate thereof is supplied with an output "out" of the op-amp 28. The second reference potential of this example is power supply potential VDD. The first reference potential is lower than the power supply potential VDD, and in this example, it is the ground potential VSS as described above. The first and second transistors 32 and 34 of this example are P-channel transistors.

The potential setting circuit 24 adds a different potential to the potential of the output n3 of the resistive dividing circuit 22. The potential of the output n3 is 0.35 V in this example. The potential is the minimum potential which the bit line clamp voltage generating circuit 14 can generate (however, the ground potential VSS is excluded. In this example, a circuit in which the potential of the bit line clamp voltage BLCLAMP is set as the ground potential is omitted). For example, the minimum potential is set equal to the determination threshold voltage of the sense amplifier 10 used to determine "1" or "0". The potential to be added by the potential setting circuit 24 is changed by use of switch signals SW_1 to SW_N. For example, as shown by the read operation waveforms of FIG. 5, the potential to be added is changed when the bit line BL is charged and when charges of the bit line BL are transferred to the sense amplifier 10 after data is read from the memory cell.

As shown in the circuit diagram of FIG. 7, the potential setting circuit 24 of this example includes N circuits 40 (40_1 to 40_N) each having one of N-channel transistors 36 (36_1 to 36_N) and one of resistors 38 (38_1 to 38_N) which are serially connected. The N circuits 40_1 to 40_N are connected in parallel between the output node n3 of the resistive dividing circuit 22 and the output node n4 of the potential setting circuit 24. The switch signals SW_1 to SW_N are input to the gates of the respective transistors 36_1 to 36_N. For example, by setting one of the switch signals SW_1 to SW_N to high level, a corresponding one of the transistors 36_1 to 36_N is turned on. Thus, the potential setting circuit 24 adds potential corresponding to the voltage drop of one of the resistors 38_1 to 38_N to the potential of the output node n3 of the resistive dividing circuit 22 and outputs the thus added result. The resistors 38_1 to 38_N have different resistances. For example, if the resistance is approximately zero and substantially no voltage drop occurs across the resistor, the potential (in this example, 0.35 V) of the output node n3 is output to the output node n4. Further, when a voltage drop of 0.25 V occurs, the potential (in this example, 0.6 V) obtained by adding 0.25 V to the potential of the output node n3 is output to the output node n4. Thus, the potential setting circuit 24 can set a plurality of bit line clamp voltages BLCLAMP by controlling the switch signals SW_1 to SW_N.

Figure 9:
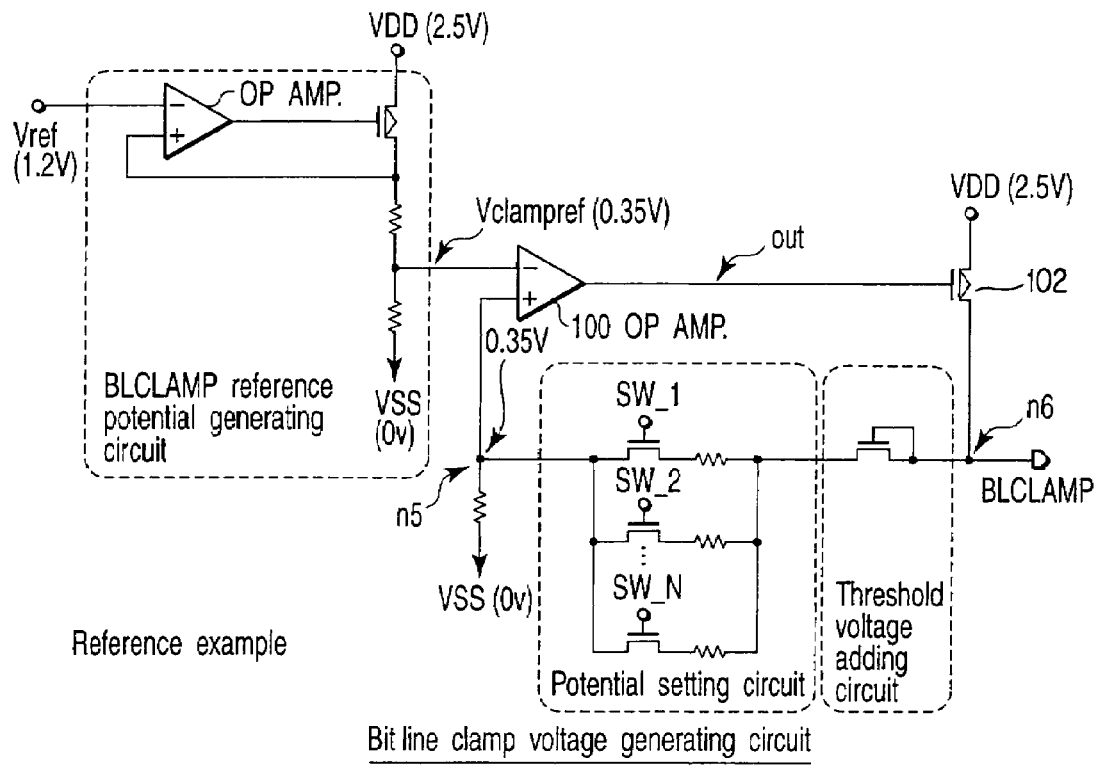
FIG. 9 is a circuit diagram showing a bit line clamp voltage generating circuit according to a reference example of this invention.

FIG. 9 is a circuit diagram showing a bit line clamp voltage generating circuit according to a reference example of this invention.

As shown in FIG. 9, the bit line clamp voltage generating circuit according to the reference example generates reference potential Vclampref from a BLCLAMP reference potential generating circuit. The reference potential Vclampref is 0.35 V. An op-amp 100 compares the reference potential Vclampref with the potential of a node n5 to control a P-channel transistor 102 and determine the potential (bit line clamp voltage BLCLAMP) of an output node n6 of the bit line clamp voltage generating circuit. The potential of the node n5 is 0.35 V.

Figure 10:
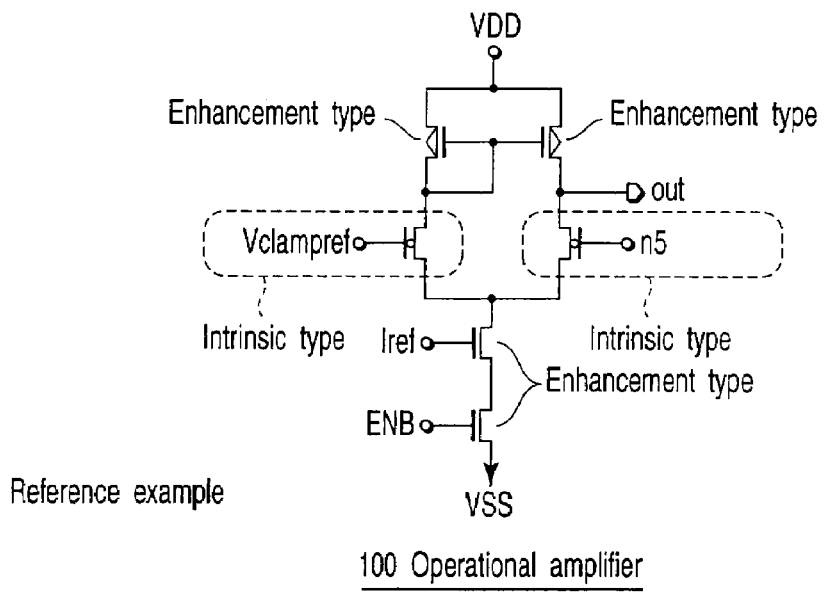
FIG. 10 is a circuit diagram showing an operational amplifier shown in FIG. 9.

The op-amp 100 receives the reference potential Vclampref and the potential of the node n5 at the input terminals thereof. The potentials are as low as 0.35 V. In order to deal with such low potentials, transistors with low threshold voltages, that is, intrinsic transistors having a threshold voltage of substantially zero are required in the op-amp 100. One example of the op-amp 100 is shown in FIG. 10. However, as described in "BACKGROUND OF THE INVENTION", the operation voltage margin of the bit line clamp voltage generating circuit using the op-amp 100 which includes intrinsic transistors is narrow.

On the other hand, the semiconductor integrated circuit device according to the first embodiment includes the current mirror circuit 20. The input stage n1 of the current mirror circuit 20 in this example is connected to the high-potential side node of the resistive dividing circuit 22. Therefore, by adjusting the resistance ratio of the resistors R1, R2 of the resistive dividing circuit 22 and the mirror ratio of the P-channel transistors 32, 34 of the current mirror circuit 20, the potential of the output node n2 of the resistive dividing circuit 22 can be set to a low potential, for example, a potential equal to the determination threshold voltage of the sense amplifier 10, for example, 0.35 V without using the intrinsic transistor of low threshold voltage. In this example, the output node n3 of the resistive dividing circuit 22 is connected to the output stage n2 of the current mirror circuit 22 via the potential setting circuit 24 and threshold voltage adding circuit 26. Then, the bit line clamp voltage BLCLAMP is derived from the output stage n2.

Thus, according to the first embodiment, since the bit line clamp voltage BLCLAMP can be generated without using the intrinsic transistors, the operable voltage range of the op-amp is not restricted by a variation in the threshold voltages of the intrinsic transistors.

Therefore, a semiconductor integrated circuit device having the bit line clamp voltage generating circuit whose operation voltage margin is wide can be attained. As a whole portion of the NAND flash memory, since the operation voltage margin of the bit line clamp voltage generating circuit 14 is enlarged, a sufficiently wide operable voltage range can be attained.

Particularly, an increase in the operation voltage margin is significant in the lower limit VDDmin of the power supply potential VDD. The lower limit VDDmin is the operable minimum power supply potential. In a NAND flash memory including the bit line clamp voltage generating circuit using intrinsic transistors, the lower limit VDDmin is limited by the op-amp using the intrinsic transistors. On the other hand, in the first embodiment, since the op-amp using the intrinsic transistors is not provided, the lower limit VDDmin is not limited by the op-amp. As a result, the lower limit VDDmin can be lowered.

An increase in the operable voltage range and a lowering in the lower limit VDDmin have an advantage that the NAND flash memory is less subject to erroneous operation caused by a variation in the power supply potential VDD and can be easily used by the user.

In the manufacturing process, since the operable voltage range is enlarged, the chances that a NAND flash memory whose voltage range exceeds the above operable voltage range is manufactured are low. This contributes to enhancement of the manufacturing yield and is advantageous in lowering the manufacturing cost.

Further, according to the semiconductor integrated circuit device of the first embodiment, the potential of the output node n2 of the resistive dividing circuit 22 can be set lower than 0.35 V by adjusting the resistance ratio of the resistive dividing circuit 22 and the mirror ratio of the current mirror circuit 20. This causes an advantage that the lower limit of the bit line clamp voltage BLCLAMP which can be generated from the bit line clamp voltage generating circuit 14 is lowered. That is, if the power supply potential VDD is lowered for acceleration of miniaturization and a lowering in the power consumption, the determination threshold voltage of the sense amplifier 10 is also lowered. Therefore, it is required for the bit line clamp voltage generating circuit 14 to generate bit line clamp voltage BLCLAMP of 0.35 V or less. According to the first embodiment, since the bit line clamp voltage BLCLAMP of 0.35 V or less can be generated, it is possible to cope with a lowering in the power supply potential VDD which is also expected in future.

Second Embodiment

Figure 11:
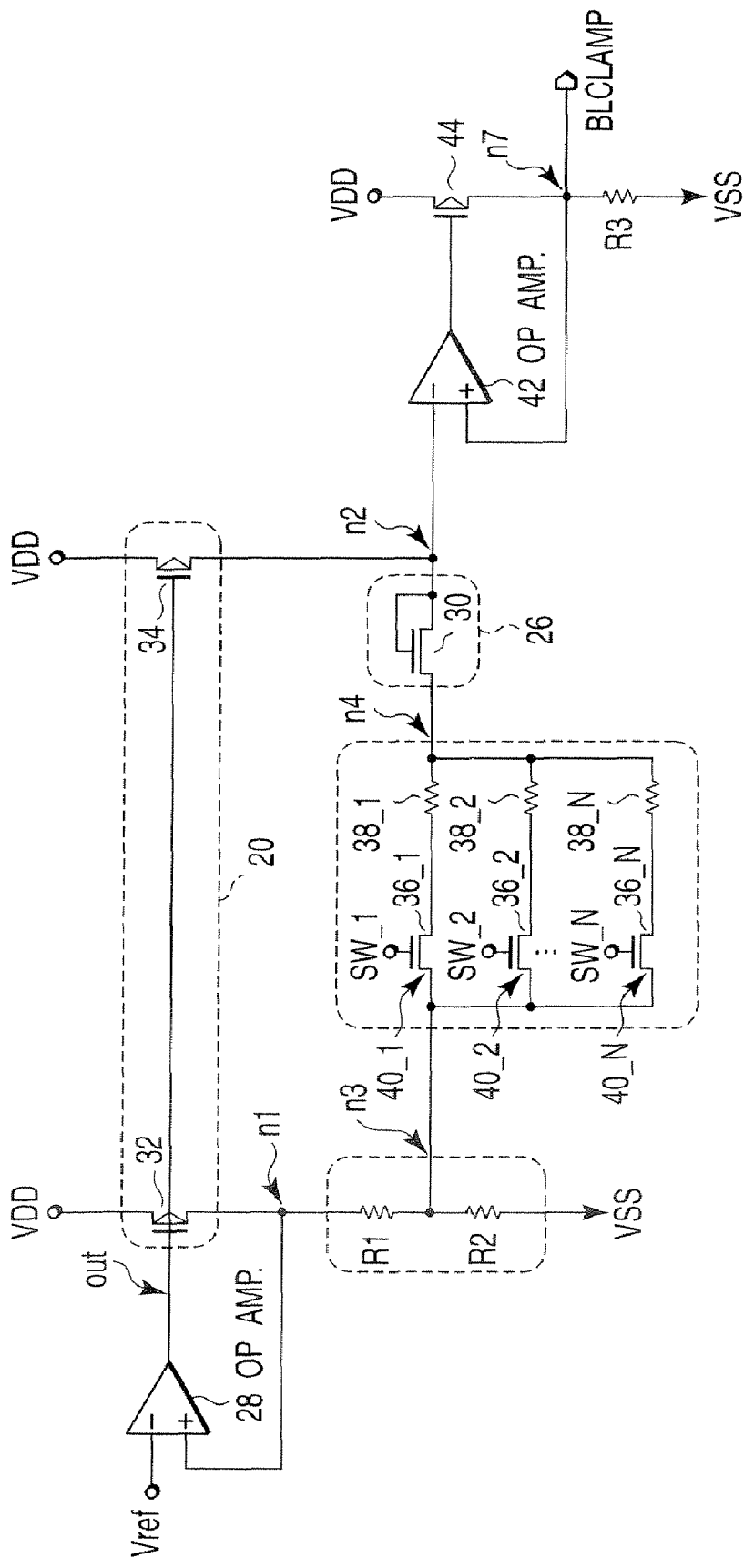
FIG. 11 is a block diagram showing one example of the configuration of a bit line clamp voltage generating circuit provided in a semiconductor integrated circuit device according to a second embodiment of this invention.

FIG. 11 is a block diagram showing one example of the configuration of a bit line clamp voltage generating circuit provided in a semiconductor integrated circuit device according to a second embodiment of this invention.

As shown in FIG. 11, the second embodiment is attained by providing a driving circuit which drives a wiring used to transmit bit line clamp voltage BLCLAMP to the gate of a charge transfer transistor 12 on the output stage n2 side of the current mirror circuit 20 of the first embodiment. In this example, an op-amp 42 is arranged on the output stage n2 side, an output of the op-amp 42 is supplied to control a P-channel transistor 44 and bit line clamp voltage BLCLAMP is derived from a node n7 of the transistor 44 and a resistor R3.

In the first embodiment, the response speed becomes low when a load connected to the output stage n2 is large and it takes a long time for the bit line clamp voltage BLCLAMP to reach a preset potential level in some cases. For example, in the first embodiment, the load connected to the output stage n2 of the current mirror circuit 20 is the gate of the charge transfer transistor 12 and the gates of a plurality of charge transfer transistors 12 are connected to the output stage n2. As the integration density of the memory cell array is enhanced and the page size is increased, the number of bit lines is increased. If the number of bit lines is increased, the number of charge transfer transistors 12 is also increased. Therefore, there occurs a strong possibility that a load connected to the output stage n2 becomes large in future.

In the second embodiment, the output stage n2 of the current mirror circuit 20 is temporarily cut off by use of the op-amp 42. Therefore, the load connected to the output stage n2 is configured only by the gates of transistors configuring the op-amp 42. Thus, even if the integration density of the memory cell array is enhanced and the page size is increased, an increase in the load of the output stage n2 can be suppressed. Further, if the load connected to the output stage n2 is configured only by the gates of transistors configuring the op-amp 42, the load of the output stage n2 can be alleviated in comparison with the case of the first embodiment.

Therefore, according to the second embodiment, the load of the output stage n2 can be alleviated in comparison with the case of the first embodiment and the operation speed which is higher in comparison with that of the first embodiment can be attained.

Thus, according to the first and second embodiments, a semiconductor integrated circuit device which includes a bit line clamp voltage generating circuit having a large operation voltage margin can be provided.

As described above, this invention is explained with reference to the first and second embodiments, but this invention is not limited to the first and second embodiments and this invention can be variously modified without departing from the technical scope thereof when embodying this invention.

Further, the above embodiments contain inventions of various stages and the inventions of various stages can be extracted by adequately combining a plurality of constituents disclosed in the above embodiments.

In addition, the above embodiments are explained based on the example in which this invention is applied to a NAND flash memory. However, this invention is not limited to a NAND flash memory and can be applied to an AND, NOR flash memory or the like other than the NAND flash memory. Further, a semiconductor integrated circuit device containing the above flash memory, for example, a processor, system LSI or the like is also contained in the scope of this invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
   a bit line;
   a sense amplifier;
   a charge transfer transistor provided between the bit line and the sense amplifier; and
   a bit line clamp voltage generating circuit which generates a bit line clamp voltage to be applied to a gate of the charge transfer transistor, the bit line clamp voltage generating circuit including a current mirror circuit having input and output stages, a resistive dividing circuit provided between the input stage of the current mirror circuit and a first reference potential node, a potential setting circuit provided between an output node of the resistive dividing circuit and the output stage of the current mirror circuit, and an operational amplifier which is configured by transistors other than intrinsic transistors and compares potential of the input stage of the current mirror circuit with a reference potential to control the current mirror circuit;
   wherein the potential setting circuit includes a first circuit including a first resistor and a first transistor connected in series to the first resistor, and a second circuit including a second resistor and a second transistor connected in series to the second resistor, the first transistor turns on when the bit line is charged in a readout operation to cause a first voltage drop to occur on the first resistor and adds the first voltage drop to a potential of the output node of the resistive dividing circuit, and the second transistor turns on when data is read out of a memory cell and then transferred to the sense amplifier to cause a second voltage drop, which is different from the first voltage drop, to occur on the second resistor and adds the second voltage drop to the potential of the output node of the resistive dividing circuit;
   wherein the bit line clamp voltage is derived from the output stage of the current mirror circuit.

2. The device according to claim 1, further comprising a threshold voltage adding circuit which is provided between the potential setting circuit and the output stage of the current mirror circuit and adds potential of threshold voltage of the charge transfer transistor.

3. The device according to claim 1, further comprising a driving circuit which is provided on the output stage side of the current mirror circuit to drive a wiring used to transmit the bit line clamp voltage to the gate of the charge transfer transistor.

4. The device according to claim 2, further comprising a driving circuit which is provided on the output stage side of the current mirror circuit to drive a wiring used to transmit the bit line clamp voltage to the gate of the charge transfer transistor.

5. The device according to claim 2, wherein the threshold voltage adding circuit includes a transistor having the same size and threshold voltage as the charge transfer transistor.

6. The device according to claim 1, wherein the current mirror circuit includes a first transistor having a current path connected at one end to a second reference potential node and connected at the other end to the input stage and a gate supplied with an output of the operational amplifier, and a second transistor having a current path connected at one end to the second reference potential node and connected at the other end to the output stage and a gate supplied with the output of the operational amplifier.

7. The device according to claim 2, wherein the current mirror circuit includes a first transistor having a current path connected at one end to a second reference potential node and connected at the other end to the input stage and a gate supplied with an output of the operational amplifier, and a second transistor having a current path connected at one end to the second reference potential node and connected at the other end to the output stage and a gate supplied with the output of the operational amplifier.

8. The device according to claim 3, wherein the current mirror circuit includes a first transistor having a current path connected at one end to a second reference potential node and connected at the other end to the input stage and a gate supplied with an output of the operational amplifier, and a second transistor having a current path connected at one end to the second reference potential node and connected at the other end to the output stage and a gate supplied with the output of the operational amplifier.

9. The device according to claim 4, wherein the current mirror circuit includes a first transistor having a current path connected at one end to a second reference potential node and connected at the other end to the input stage and a gate supplied with an output of the operational amplifier, and a second transistor having a current path connected at one end to the second reference potential node and connected at the other end to the output stage and a gate supplied with the output of the operational amplifier.

10. The device according to claim 1, wherein the potential setting circuit further includes a third circuit having a third resistor and a third transistor connected in series to the third resistor, and the third transistor turns on except when the bit line is charged in readout operation and except when data is read out of the memory cell and then transferred to the sense amplifier to cause a third voltage drop which is different from the first and second voltage drops to occur and add the third voltage drop to the potential of the output node of the resistive dividing circuit.

* * * * *